(12) United States Patent
Zamprogno et al.

(10) Patent No.: US 10,348,258 B2
(45) Date of Patent: Jul. 9, 2019

(54) SINGLE-STAGE DIFFERENTIAL OPERATIONAL AMPLIFIER WITH IMPROVED ELECTRICAL FEATURES

(71) Applicant: STMicroelectronics S.r.l., Agrate Brianza (IT)

(72) Inventors: Marco Zamprogno, Cesano Maderno (IT); Maurizio Bongiorni, Buccinasco (IT); Pasquale Flora, Busto Arsizio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/975,505

(22) Filed: May 9, 2018

(65) Prior Publication Data

US 2018/0342994 A1    Nov. 29, 2018

(30) Foreign Application Priority Data

May 25, 2017  (IT) .................. 102017000057077

(51) Int. Cl.
*H03F 3/45* (2006.01)
*H03F 1/02* (2006.01)

(52) U.S. Cl.
CPC ....... *H03F 3/45273* (2013.01); *H03F 1/0205* (2013.01); *H03F 3/45183* (2013.01);
(Continued)

(58) Field of Classification Search
CPC .................................................. H03F 3/45273
See application file for complete search history.

(56) References Cited

U.S. PATENT DOCUMENTS 7,119,612 B1 * 10/2006 Holloway ................. H03F 1/02
330/9
2007/0046378 A1 * 3/2007 Baum ................... H03F 3/3028
330/311

(Continued)

FOREIGN PATENT DOCUMENTS

WO         98/28840 A2    7/1998

OTHER PUBLICATIONS

Huang et al., "A 2-V 10.7-MHz CMOS Limiting Amplifier/RSSI," *IEEE Journal of Solid-State Circuits* 35(10):1474-1480, Oct. 2000.
(Continued)

*Primary Examiner* — Patricia T Nguyen
(74) *Attorney, Agent, or Firm* — Seed IP Law Group LLP

(57) ABSTRACT

A single-stage differential operational amplifier including an input stage formed by a pair of input transistors having control terminals connected to a respective first and second input, first conduction terminals coupled to a respective first and second output and second conduction terminals coupled to receive a polarization current. An output stage is formed by a pair of output transistors in diode configuration and having control terminals coupled to a relative first conduction terminal and connected to a respective first and second output, and second conduction terminals connected to a reference line. A coupling stage is interposed between the first conduction terminals of the output transistors and the first and second outputs to define the diode configuration of the output transistors and a gain value of the operational amplifier.

20 Claims, 5 Drawing Sheets

(52) U.S. Cl.
CPC ..... *H03F 3/45188* (2013.01); *H03F 3/45192* (2013.01); *H03F 3/45632* (2013.01); *H03F 2200/513* (2013.01); *H03F 2203/45654* (2013.01)

(56) References Cited

U.S. PATENT DOCUMENTS

| | | | | |
|---|---|---|---|---|
| 2007/0085608 A1* | 4/2007 | Iriguchi | ............... | G09G 3/3688 330/260 |
| 2008/0068081 A1* | 3/2008 | Alenin | ...................... | H03F 1/52 330/253 |
| 2008/0290942 A1* | 11/2008 | Shimizu | .............. | H03F 3/45188 330/253 |
| 2010/0264986 A1* | 10/2010 | Eschauzier | ......... | H03F 3/45192 330/253 |

OTHER PUBLICATIONS

López-Martin et al., "Low-Voltage Super Class AB CMOS OTA Cells With Very High Slew Rate and Power Efficiency," *IEEE Journal of Solid-State Circuits* 40(5):1068-1077, May 2005.
Ramos et al., "Design tradeoffs for sub-mW CMOS biomedical limiting amplifiers," *Microelectronics Journal* 44:904-911, 2013.

\* cited by examiner

SINGLE-STAGE DIFFERENTIAL OPERATIONAL AMPLIFIER WITH IMPROVED ELECTRICAL FEATURES

BACKGROUND

Technical Field

The present disclosure pertains to a single-stage differential operational amplifier having improved electrical features.

Description of the Related Art

There are numerous applications which require the use of single-stage operational amplifiers (also known as OTAs, Operational Transconductance Amplifiers), having an elevated gain for low signals and an elevated value of the so-called gain bandwidth product (GBWP), and a common mode output (or continuous or time-invariant output having a direct current (DC) value) having an established or at least a controlled value.

For example, in comparator circuits used for successive approximation analog/digital converters (so-called successive approximation register (SAR) analog to digital (AD) converters), operational amplifiers with such desirable features are used to realize a pre-amplification stage, which requires rapid response times (for example, less than 10 ns) and an elevated sensitivity (for example, with the ability to discriminate voltage differences less than 100 μV).

The present patent applicant has verified that known solutions for the realization of single-stage differential operational amplifiers are generally not entirely satisfactory. In particular, it has proven to be hard to obtain both the aforesaid requirements of gain for a small signal, quick response time and common mode output.

FIG. 1 shows a single-stage operational amplifier circuit, indicated generally by reference 1, of known type.

The operational amplifier 1 is fully differential, with differential inputs $IN_+$ and $IN_-$ and also differential outputs $OUT_+$ and $OUT_-$, and it includes: a pair of input MOS transistors M1, M2, of PMOS type, having gate terminals connected to a respective input $IN_+$, $IN_-$, drain terminals connected to a respective output $OUT_-$, $OUT_+$ and source terminals connected together to the same polarization current generator 2 furnishing a biasing or polarization current $I_b$. A pair of output MOS transistors M3, M4, of NMOS type are connected in diode manner, or with gate terminals coupled to respective drain terminals and connected to a respective output $OUT_-$, $OUT_+$, and source terminals connected together to a ground reference gnd.

At least in the simplest case in which all the transistors are biased or polarized in the saturation region, the continuous gain G of the operational amplifier 1 is given by the following expression:

$$G \cong \frac{g_{m1}}{g_{m3}} \cong \frac{\left(\frac{W}{L}\right)_1}{\left(\frac{W}{L}\right)_3} \cdot k$$

where $g_{m1}$ is the transconductance of the input transistor, transistor M1, $g_{m3}$ is the transconductance of the output (or load) transistor, transistor M3, $(W/L)_1$ and $(W/L)_3$ are the form factors (or the ratios between channel width and channel length) of the same transistors M1 and M3, and where k is a correction factor taking into account the different mobilities of the n-channel and the p-channel transistors and any inhomogeneities of polarization.

In other words, since the transistors M1 and M3 are, at least in a first approximation, polarized by the same polarization current $I_b$, the gain G of the operational amplifier 1 is essentially defined by the ratio between the form factors of the same transistors M1 and M3.

The operational amplifier 1 has a reduced area occupancy and a reduced power consumption, and furthermore makes it possible to obtain an elevated gain bandwidth product (GBWP). Moreover, the DC value of the common mode output voltage is set by the gate-source voltage $V_{gs}$ of the output transistor, transistor M3, thus having a value which can be dimensioned in appropriate manner.

Even so, taking into account the polarization relations of the transistors, the maximum achievable value for the gain G is typically less than 20 dB.

Such a circuit solution has some performance limits, for example, in the event of being used as a first amplification stage for the realization of the pre-amplification stage of a comparator for an analog to digital converter SAR, in which, as previously discussed, an elevated gain value for a small signal is required.

FIG. 2 shows a further circuit realization of known type for a single-stage operational amplifier, in this case designated as 10.

The operational amplifier 10, once again of fully differential type, includes in this case a pair of input MOS transistors, M1, M2, of NMOS type, having gate terminals connected to a respective input $IN_+$, $IN_-$, source terminals connected together to a first polarization current generator 12 which absorbs a polarization current $I_b$, and drain terminals connected respectively to a first and a second internal node N1, N2, which are in turn coupled to a second and a third polarization current generator 14a, 14b. A pair of output MOS transistors, M3, M4, these also of NMOS type, connected in diode manner, or with gate terminals, coupled to the respective drain terminals, connected to a respective output $OUT_-$, $OUT_+$ and source terminals connected together to a ground reference gnd.

The operational amplifier 10 further includes: a first and a second cascode MOS transistor, Mc1, Mc2, of PMOS type, connected between the first internal node N1 and the output $OUT_-$ and, respectively, between the second internal node N2 and the output $OUT_+$, and having gate terminals receiving a common polarization voltage $V_b$; and a fourth and a fifth polarization current generator 16a, 16b, connected between the output $OUT_-$, or respectively the output $OUT_+$, and the ground reference gnd.

It is possible to show that also in this case the gain G of the operational amplifier 10 is given by the following expression:

$$G \cong \frac{g_{m1}}{g_{m3}} \cong \frac{\left(\frac{W}{L}\right)_1}{\left(\frac{W}{L}\right)_3} \cdot k$$

where k is a factor which in this case however also takes account of the polarization currents generated by the polarization current generators 12, 14a-14b and 16a-16b.

Thus, such a gain may be incremented with respect to only the ratio of the form factors (W/L) of the input and output transistors, the transistors M1 and M3, by acting in appropriate manner on the ratios between the polarization currents (in particular, by polarizing the output MOS transistors M3, M4 with polarization currents of lesser value as compared to the input MOS transistors M1, M2) Even so, it is possible to show that the maximum achievable value also in this case is in fact little more than 20 dB.

Furthermore, even though in this case it is possible to achieve elevated values of the gain bandwidth product GBWP, the operational amplifier 10 requires a larger area occupancy and a greater power consumption, and is more sensitive to noise and any offset present in the circuit.

FIG. 3 shows yet another circuit realization of known type for a single-stage operational amplifier, in this case indicated by 20.

The operational amplifier 20, once again fully differential, includes: a pair of input MOS transistors, M1, M2, of PMOS type, having gate terminals connected to a respective input $IN_+$, $IN_-$, drain terminals connected to a respective output $OUT_-$, $OUT_+$ and source terminals connected together to a polarization current generator 22 furnishing a polarization current $I_b$; and a pair of output MOS transistors, M3, M4, of NMOS type, in current generator configuration, with gate terminals connected to each other, drain terminals connected to a respective output $OUT_-$, $OUT_+$ and source terminals connected together to a ground reference gnd.

The operational amplifier 20 further includes a common mode control stage 24, having the function of setting the common mode value of the output voltage, by imposing a common mode feedback voltage $V_{cm\_fdbk}$ on the gate terminals of the transistors M3 and M4, with a value which is a function of the output voltage.

The common mode control stage 24 includes: a resistive divider 25, formed by a first divider resistor 25a connected between the output $OUT_+$ and a division node $N_p$ and by a second divider resistor 25b connected between the division node $N_p$ and the output $OUT_-$; and an amplifier 26, having a first input terminal, positive, connected to the division node $N_p$, and a second input terminal, negative, receiving a common mode reference voltage $V_{cm}$, and furnishing to an output terminal the common mode feedback voltage $V_{cm\_fdbk}$.

In this case, it can be shown that the gain G of the operational amplifier circuit 20 is given by:

$$G \cong g_{m1} \cdot (r_{ds1} \| r_{ds3})$$

where $r_{ds1}$ is the drain-source resistance of the input transistor, transistor M1, and $r_{ds3}$ is the drain-source resistance of the output transistor, transistor M3.

Thanks to the elevated value of the drain-source resistance of the MOS transistors, the gain G in this case may reach values even on the order of 40 dB.

Even so, as shown, there needs to be present a dedicated control loop for the feedback control of the common mode output voltage (common mode control stage 24), which entails an increase in the area occupancy and the electrical power consumption, and furthermore causes limitations on the bandwidth and frequency response of the amplifier circuit.

Furthermore, there are other circuit solutions present in the prior art for the realization of single-stage differential operational amplifiers; for example, the document: "Low-Voltage Super Class AB CMOS OTA Cells With Very High Slew Rate and Power Efficiency", Antonio J. Lopez-Martin, Suhmita Baswa, Jaime Ramirez-Angulo, Ramon Gonzalez Carvajal, IEEE JOURNAL OF SOLID-STATE CIRCUITS, VOL. 40, NO. 5, May 2005, describes several further sample embodiments which, however, also share the problems previously mentioned, including a complex realization.

The solutions which have been proposed thus far for the realization of single-stage differential operational amplifiers are therefore not entirely satisfactory, especially for certain technical applications, such as the realization of pre-amplification stages of comparators for analog/digital converters, as previously mentioned.

BRIEF SUMMARY

The purpose of the present disclosure is to provide an operational amplifier having improved electrical features.

BRIEF DESCRIPTION OF THE SEVERAL VIEWS OF THE DRAWINGS

For a better understanding of the present disclosure, preferred embodiments shall now be described, merely as a nonlimiting example and with reference to the appended drawings, in which.

DETAILED DESCRIPTION

Figure 1:
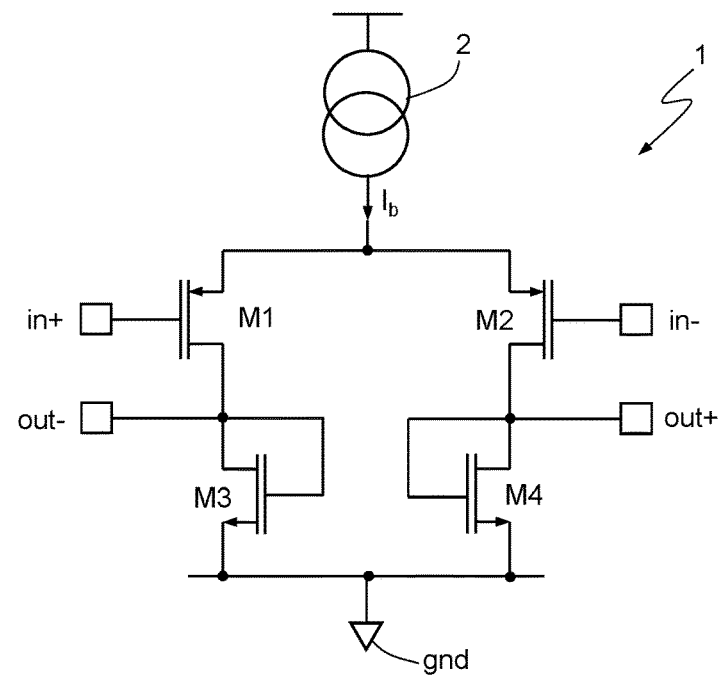
FIG. 1 shows the circuit diagram of a single-stage operational amplifier of known type.
Figure 2:
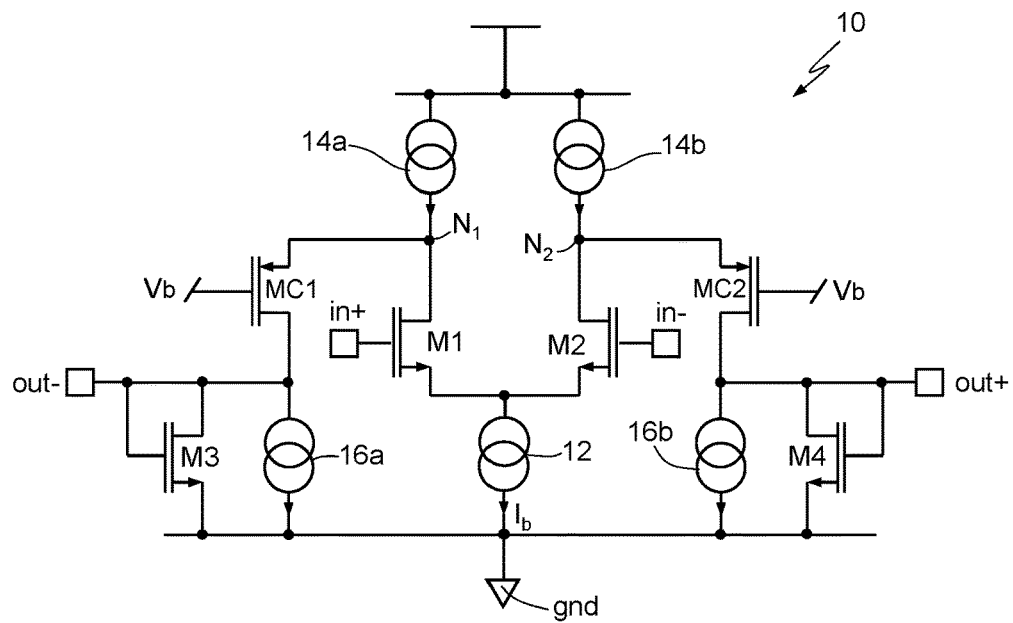
FIG. 2 shows the circuit diagram of another single-stage operational amplifier of known type.
Figure 3:
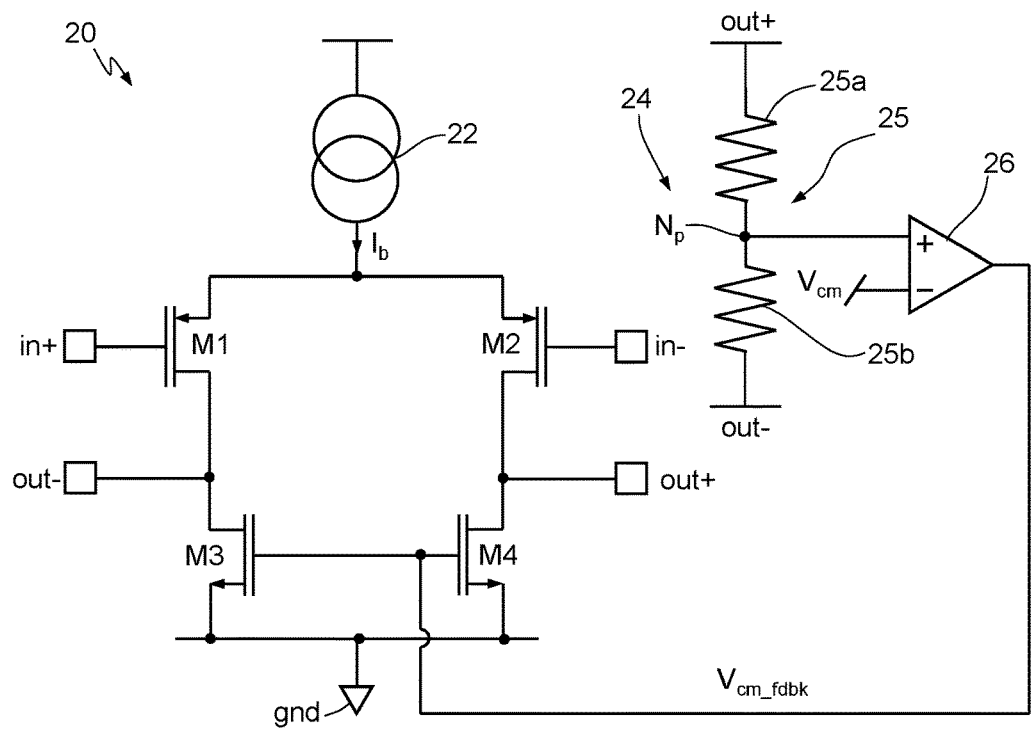
FIG. 3 shows the circuit diagram of yet another single-stage operational amplifier of known type.
Figure 4:
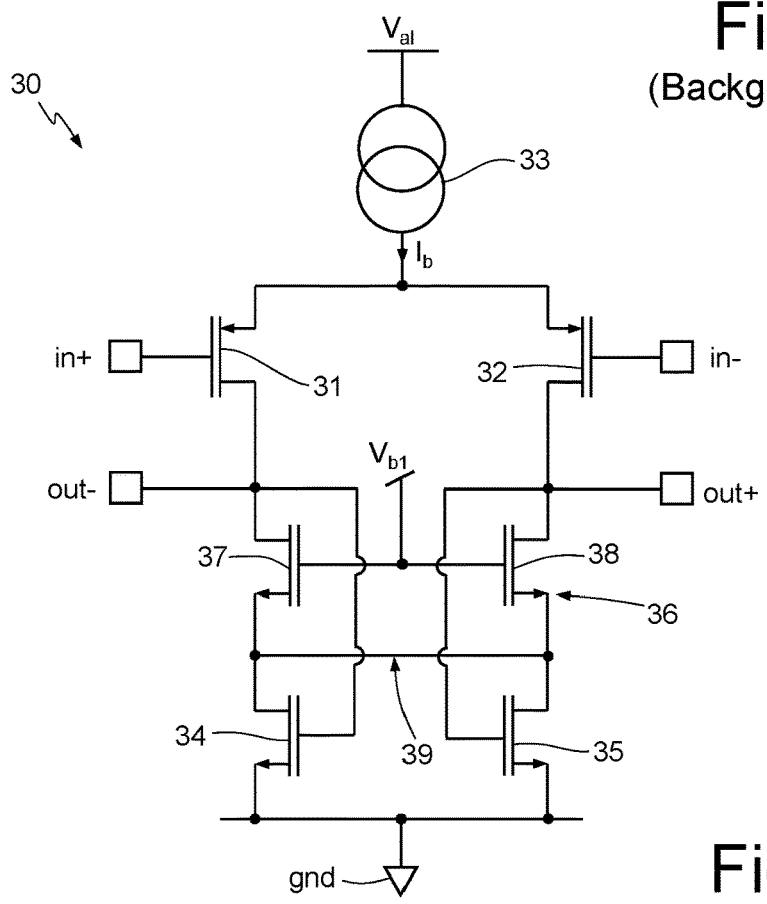
FIG. 4 shows the circuit diagram of a single-stage operational amplifier according to one embodiment of the present solution.

As illustrated in FIG. 4, an operational amplifier 30, according to one embodiment of the present solution, is of fully differential type, single-stage, with differential inputs $IN_+$ and $IN_-$ and likewise differential outputs $OUT_+$ and $OUT_-$ and it includes: an input stage formed by a pair of input MOS transistors, 31, 32, of PMOS type, having gate terminals (in general, control terminals) connected to a respective input $IN_+$, $IN_-$, drain terminals (in general, first conduction terminals) connected, in this case directly, to a respective output $OUT_-$, $OUT_+$, and source terminals (in general, second conduction terminals) connected together to the same polarization current generator 33, energized by a power supply voltage $V_{a1}$ and furnishing a polarization current $I_b$; and an output stage formed by a pair of output MOS transistors, 34, 35, of NMOS type, in diode-like configuration (or with the gate terminals able to be connected to the drain terminals), with gate terminals connected to a respective output $OUT_-$, $OUT_+$, and source terminals connected together to a ground reference gnd.

According to one particular aspect of the present solution, the operational amplifier 30 furthermore includes a coupling stage 36, connected (interposed) between the drain terminals of the output MOS transistors 34, 35 and the outputs $OUT_-$, OUT$_+$ and configured to impose the gain value of the operational amplifier 30 itself, as shall be better described below.

In detail, the coupling stage 36 includes a first and a second coupling MOS transistor 37, 38, of NMOS type, having gate terminals connected to each other and receiving a biasing or polarization voltage V$_{b1}$ (having an adequate value to guarantee its correct polarization), drain terminals connected respectively to the output OUT$_-$ and to the output OUT$_+$, and source terminals connected directly to each other by a connection line 39.

The first and the second coupling MOS transistor 37, 38 act as cascode transistors with respect to the output MOS transistors 34, 35 Furthermore, for the alternating current (AC) or time varying behavior for a small signal, the connection line 39 represents a virtual grounding line, so that it is easy to show that the gain G of the operational amplifier 30 is given by:

$$G \cong g_{m1} \cdot (r_{ds3} \| r_{ds1})$$

where r$_{ds3}$ is the drain-source resistance of the coupling MOS transistor 37, and r$_{ds1}$ is the drain-source resistance of the input MOS transistor 31.

Advantageously, the operational amplifier 30 provides an elevated gain value (defined by the parallel connection of the resistances r$_{ds1}$ and r$_{ds3}$). Such a gain G may for example reach values on the order of 40 dB.

Moreover, advantageously, the value of the common mode output voltage is set by the gate-source voltage of the output MOS transistors 34, 35, thus depending on a controlled and regulated circuit parameter (and therefore definable in appropriate manner during the design phase).

Figure 5:
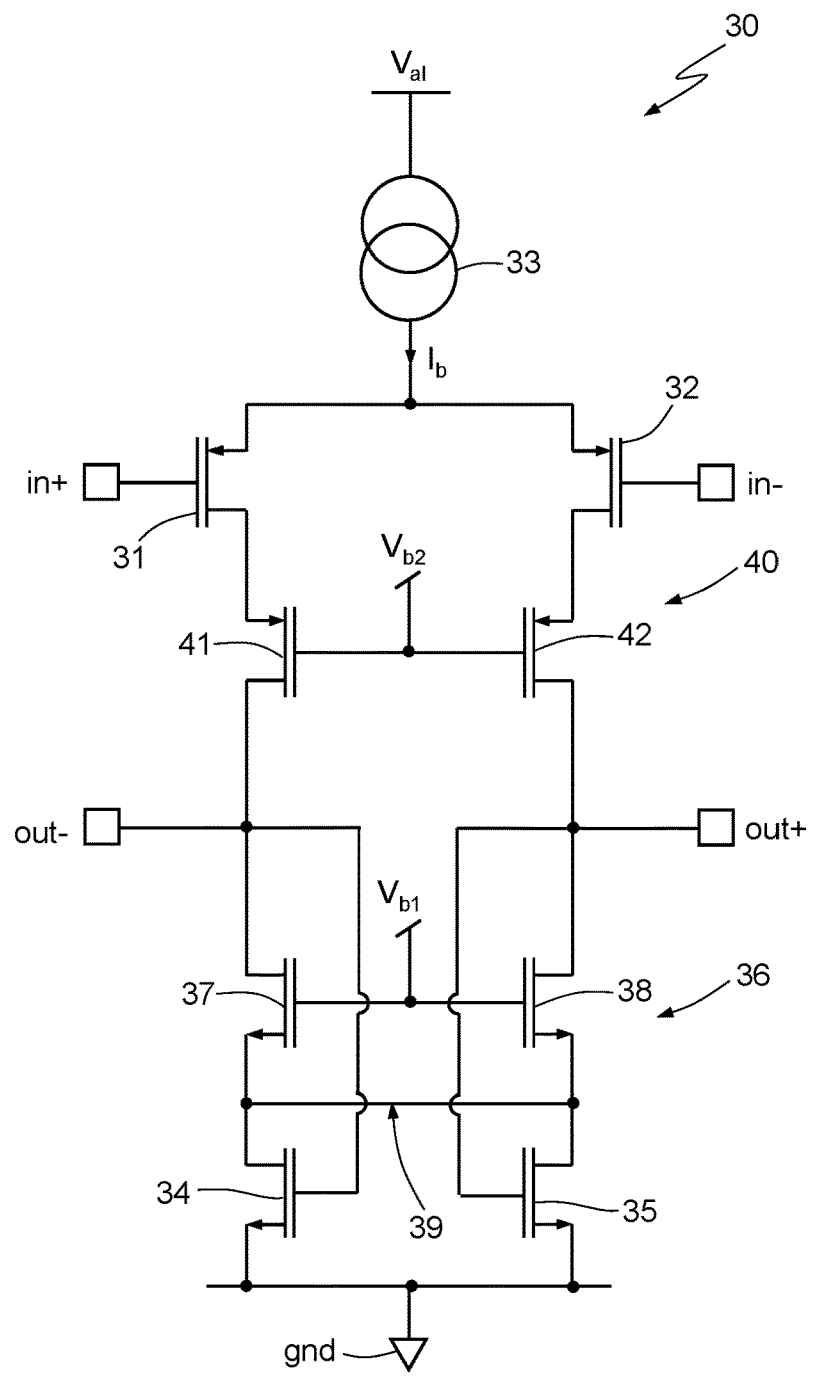
FIGS. 5-6 show circuit diagrams of the single-stage operational amplifier according to variants of the present solution.

In a further embodiment, shown in FIG. 5, the operational amplifier 30 further includes as cascode input stage 40 formed by a first and a second cascode MOS transistor, 41, 42, of PMOS type: in particular, the first cascode MOS transistor 41 couples the drain terminal of the first input MOS transistor 31 to the output OUT$_-$, and the second cascode MOS transistor 42 couples the drain terminal of the second input MOS transistor 32 to the output OUT$_+$. Furthermore, the gate terminals of the cascode MOS transistors 41, 42 receive a second polarization voltage V$_{b2}$.

Advantageously, the presence of the cascode MOS transistors 41, 42 makes it possible to increase, by the cascode effect, the value of the drain-source resistance r$_{ds1}$ of the input MOS transistor 31, so as to further increase the value of the gain G of the operational amplifier 30 (which in this case is in fact given by the expression:

$$G = (g_{m1} \cdot r_{ds3})$$

Figure 6:
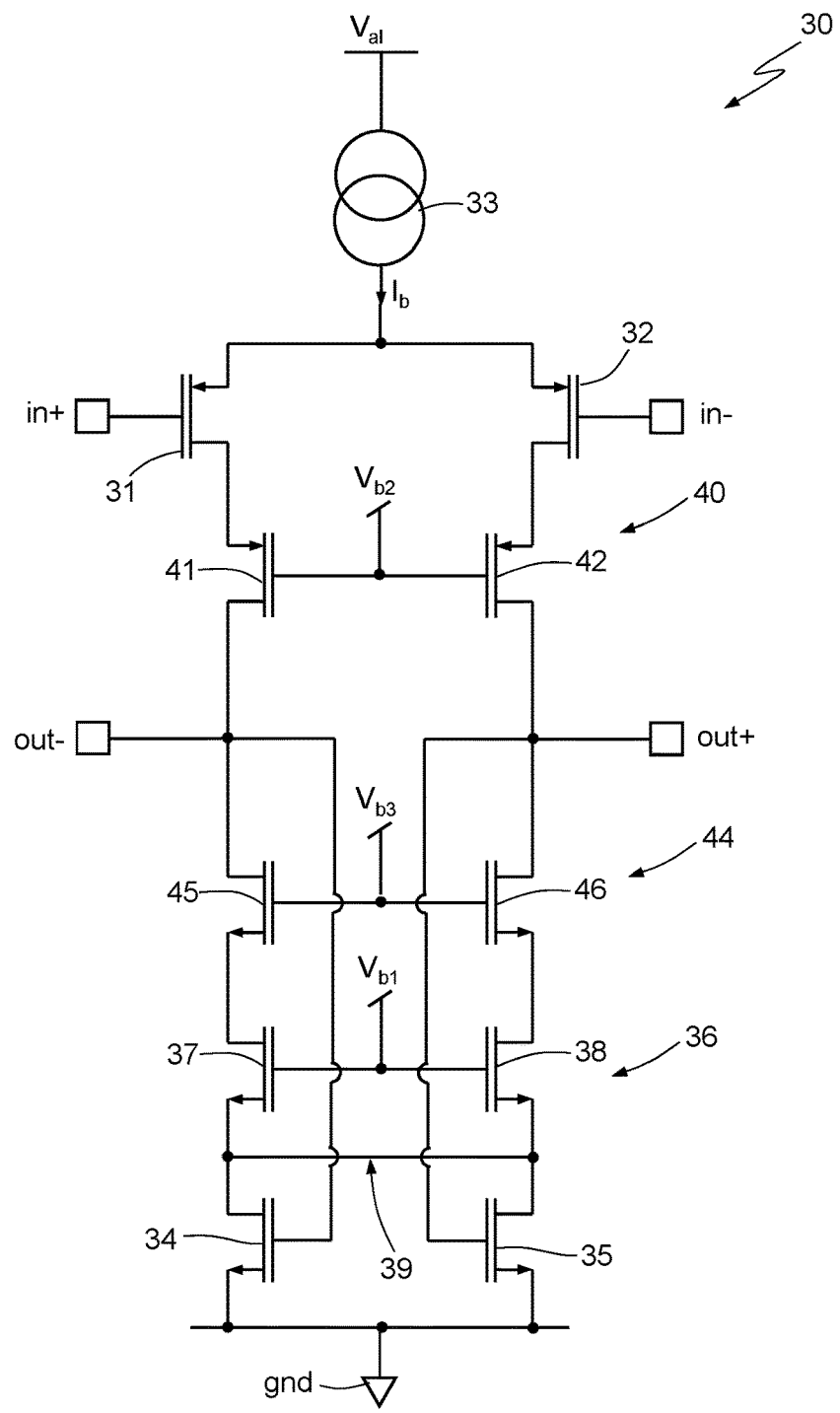

According to a further embodiment, shown in FIG. 6, in the case when the power supply V$_{a1}$ is sufficiently elevated, the operational amplifier 30 may further comprise a cascode output stage 44, formed by a third and a fourth cascode MOS transistor, 45, 46, of NMOS type. In particular, the third cascode MOS transistor 45 is connected between the drain terminal of the first coupling MOS transistor 37 and the output OUT$_-$ and the fourth cascode MOS transistor 46 is connected between the drain terminal of the second coupling MOS transistor 38 and the output OUT$_+$. Furthermore, the gate terminals of the cascode MOS transistors 45, 46 receive a third polarization voltage V$_{b3}$.

In this case, therefore, the coupling stage 36 is coupled to the drain terminals of the output MOS transistors 34, 35 and is further coupled to the outputs OUT$_-$, OUT$_+$ via the cascode output stage 44.

The presence of the cascode output stage 44 advantageously allows a further increasing of the value of the gain G of the operational amplifier 30, since the cascode effect is such as to produce an increase in the value of the drain-source resistance r$_{ds3}$ of the output MOS transistor 34.

The advantages of the described solution will emerge in obvious fashion from the preceding description.

In any case, it is once more emphasized that such a solution makes it possible to obtain improved electrical features for a single-stage differential operational amplifier, especially as regards increasing the relative gain value G for a small signal, and furthermore guaranteeing reduced response times (settling time) and elevated sensitivity.

These advantages are obtained without significantly increasing the area occupancy, the power consumption, or compromising the noise and offset performance of the amplifier circuit.

The aforesaid advantages are particularly important for example in the case where the operational amplifier 30 is used as the first amplification stage of a comparator, such as an AD converter of SAR type.

Figure 7:
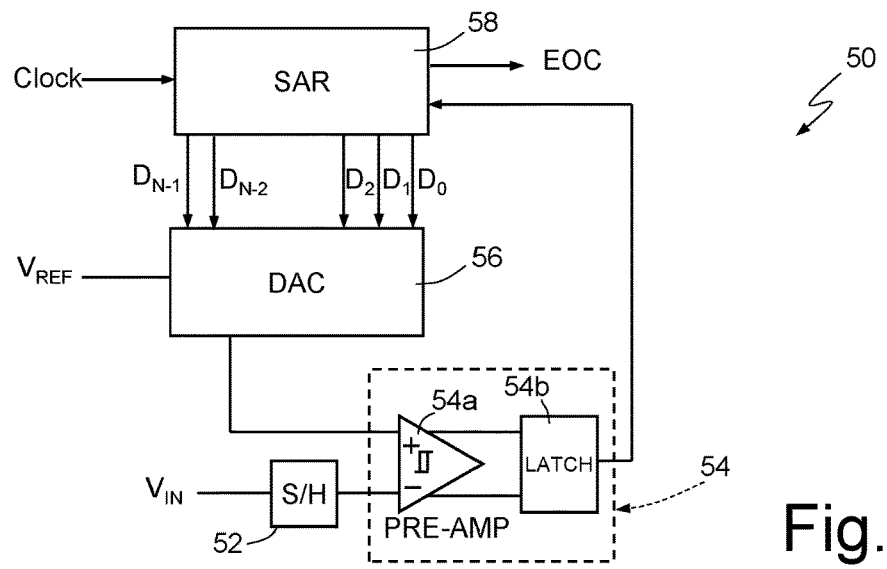
FIG. 7 is a main block diagram of an electronic circuit incorporating the single-stage operational amplifier of FIG. 4 according to one embodiment of the present solution.

In this regard, FIG. 7 shows the main diagram of a successive approximation AD converter circuit 50 (SAR), and comprising: a sample and hold (S/H) stage 52 for the acquisition of an analog input voltage V$_{in}$, which is to be converted to digital; a voltage comparator 54; a DAC converter 56, receiving a reference voltage V$_{REF}$; and a successive approximation register 58, timed by a clock signal.

The voltage comparator 54 compares the input voltage V$_{in}$ to the output of the DAC converter 56 and sends the result to the successive approximation register 58, which in turn generates a digital code formed by N bits (D$_0$, D$_1$, ... D$_{N-1}$), indicative of the value of that input voltage V$_{in}$ provided to the DAC converter 56; the output of the DAC converter 56 returns to the voltage comparator 54, with an analog signal equivalent to the output digital code of the successive approximation register 58, for comparing with the input voltage V$_{in}$. The conversion operation concludes with the issuing of an end of conversion (EOC) signal.

In particular, the voltage comparator 54 includes a pre-amplification stage 54a and a latch stage 54b, connected in cascade to the pre-amplification stage 54a According to one embodiment of the present solution, the pre-amplification stage 54a includes the operational amplifier 30 described in detail previously, whose realization makes it possible to achieve extremely rapid response times (even less than 10 ns) and an elevated sensitivity, so as to reach very reduced values of the least significant bit (LSB) of the digital code generated by the AD converter circuit 50, for example less than 400 µV.

In particular, the possibility of setting the value of the common mode output voltage of the operational amplifier 30 makes it possible to regulate in appropriate manner the common mode of the DAC converter 56 during the sampling of the input voltage V$_{in}$, in the successive approximation functioning.

The DAC converter 56 may in such a case have optimal conversion performance, with an elevated sampling frequency (for example, around 2.5 MHz) and resolution (for example, 12 bits), utilizing a low power supply voltage, such as one equal to 1.8 V.

Finally, it is clear that modifications and variants can be made in what has been described and illustrated above without thereby leaving the scope of protection of the present disclosure, as defined in the appended claims.

Figure 8:
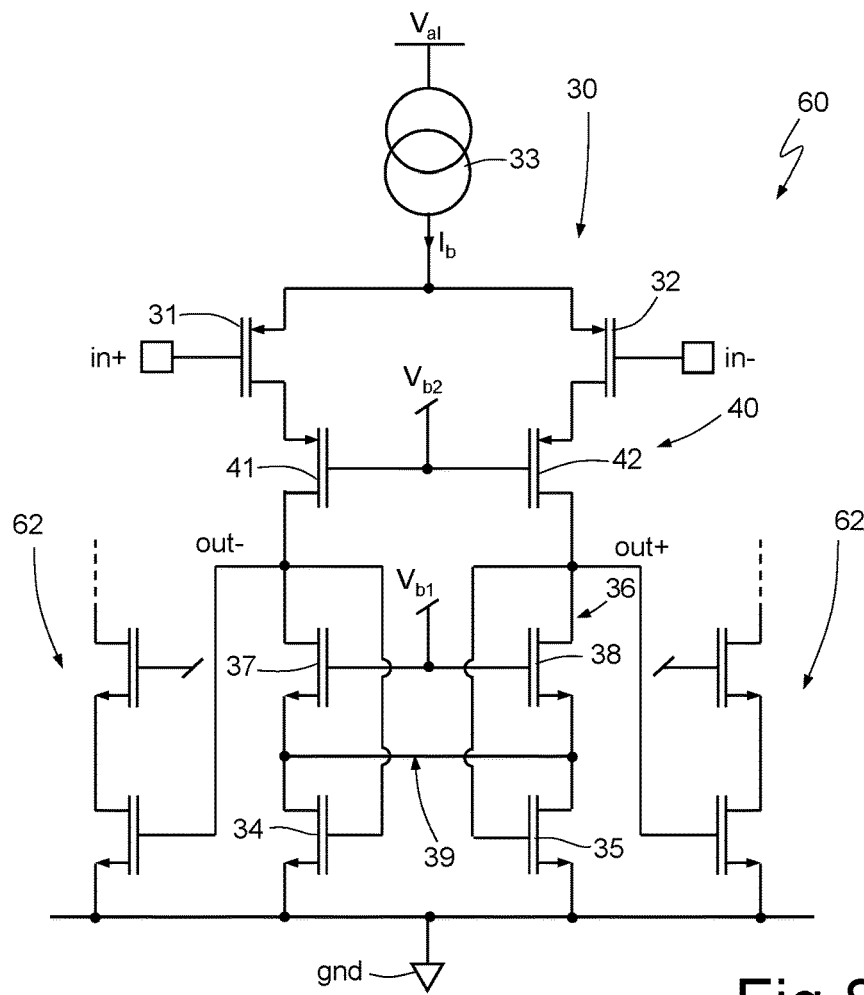
FIG. 8 shows one embodiment of a multi-stage amplifier circuit according to a further embodiment of the present solution.

For example, as illustrated in FIG. 8, the proposed solution may be used advantageously also in the case where the operational amplifier 30 represents the first stage of a multi-stage amplifier circuit 60, comprising at least one further amplification stage 62, connected in cascade to the operational amplifier 30.

In particular, based on what has been discussed above, the outputs OUT_, OUT_+ of the operational amplifier 30 act, for the DC polarization or operating condition, as common gate/drain terminals for the output MOS transistors 34, 35, in diode-like configuration, while for the AC conditions of a small signal, the same outputs OUT_, OUT_+ represent high-impedance nodes. Advantageously, the operational amplifier 30 defines for the amplifier circuit 60 a first amplification stage having a controlled common mode output voltage and an elevated gain.

As illustrated again in FIG. 8, the further amplification stage 62 of the amplifier circuit 60 may advantageously implement at the input a current mirroring configuration jointly for the output MOS transistors 34, 35 of the operational amplifier 30, so as to define a definite and controlled current polarization for the following elements of the circuit.

Based on what has been discussed, it is further evident that the operational amplifier 30 may also be used advantageously for other applications, such as in integrator stages of sigma delta analog/digital converters or in any case in applications where an amplification stage with reduced circuit complexity is required, ensuring an elevated gain and a controlled and regulatable output common mode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A single-stage differential operational amplifier, comprising:
an input stage formed by first and second input transistors having control terminals coupled to first and second inputs, respectively, of the operational amplifier, the first and second input transistors including first conduction terminals coupled to first and second outputs, respectively, of the operational amplifier and including second conduction terminals configured to receive a polarization current;
an output stage formed by first and second output transistors in diode-like configuration having control terminals coupled to a first conduction terminals that are coupled to first and second outputs, respectively, and the first and second output transistors having second conduction terminals connected to a reference line; and
a coupling stage interposed between the first conduction terminals of the first and second output transistors and the first and second outputs, respectively, the coupling stage configured to define a gain value of the operational amplifier, the coupling stage further including a connection line connected between the first conduction terminals of the first and second output transistors.

2. The operational amplifier according to claim 1, wherein the coupling stage comprises a first and a second coupling transistor having control terminals connected together and configured to receive a first polarization voltage, the first and second coupling transistors having first conduction terminals connected to the first and second outputs, respectively, and a connection line couples together the second conduction terminals of the first and second coupling transistors.

3. The operational amplifier according to claim 2, wherein the connection line directly connects the second conduction terminals of the first and second coupling transistors.

4. The operational amplifier according to claim 2, wherein the gain is given by:

$$G \cong g_{m1} \cdot r_{ds3}$$

where $r_{ds3}$ is the resistance between the first and second conduction terminals of the first coupling transistor coupled to the first output, and $g_{m1}$ is the transconductance of the first input transistor coupled to the first input.

5. The operational amplifier according to claim 1, wherein the first and second coupling transistors are NMOS transistors and the connection line connects the source terminals of said the first and second coupling transistors.

6. The operational amplifier according to claim 1, wherein the voltage between the control terminal and the second conduction terminal of the first output transistor coupled to the first output defines a common mode output voltage of the operational amplifier.

7. The operational amplifier according to claim 1 further comprising a cascode input stage formed by a first and a second cascode transistor coupled between the first conduction terminals of the first and second input transistors, respectively, and the first and second outputs, respectively, and the first and second cascode transistors having control terminals configured to receive a second polarization voltage.

8. The operational amplifier according to claim 7, further comprising a cascode output stage including a third and a fourth cascode transistor coupled between the coupling stage and the first and second outputs, respectively, and having control terminals configured to receive a third polarization voltage.

9. The operational amplifier according to claim 1, wherein said the first and second input transistors are PMOS transistors having source terminals configured to receive the polarization current from a polarization current generator.

10. The operational amplifier according to claim 9, wherein said the first and second output transistors are NMOS transistors having source terminals connected to the reference line.

11. A circuit, comprising:
a first amplification stage including an operational amplifier including first and second input nodes and first and second output nodes, the operational amplifier including,
an input stage circuit including first and second input transistors, each of the first and second input transistors having first and second signal nodes and a control node, the first signal node of the first input transistor coupled to the first output node and the control node coupled to the first input node, the first signal node of the second input transistor coupled to the second output node and the control node coupled to the second input node, and each of the second signal nodes configured to receive a biasing current;
an output stage circuit including first and second output transistors, each of the first and second output transistors having first and second signal nodes and a control node, the first signal nodes of the first and second output transistors coupled to a reference node, the control node of the first output transistor coupled to the first output node and the control node of the second output transistor coupled to the second output node, and the second signal node of the first output transistor being connected to the second signal node of the second output transistor; and a coupling stage circuit including first and second coupling transistors, each of the first and second coupling transistors having first and second signal nodes and a control node, the first signal node of the first coupling transistor coupled to the second signal node of the first output transistor and the second signal node of the first coupling transistor coupled to the first output node, the first signal node of the second coupling transistor coupled to the second signal node of the second output transistor and the second signal node of the second coupling transistor coupled to the second output node, and the control nodes of the first and second coupling transistors coupled to receive a first biasing voltage.

12. The circuit of claim 11 further comprising at least one further amplification stage coupled to the first amplification stage.

13. The circuit of claim 11 further comprising a voltage comparator having a pre-amplification stage circuit including the first amplification stage and a latch stage circuit coupled in cascade to the pre-amplification stage circuit.

14. The circuit of claim 11, further comprising a biasing current generator coupled to the operational amplifier and configured to provide the biasing current.

15. The circuit of claim 11, wherein the first and second input transistors are PMOS transistors and the first and second output transistors and the first and second coupling transistors are NMOS transistors.

16. The circuit of claim 11 further comprising a cascode input stage circuit including a first cascode transistor coupled between the first output node and the first signal node of the first input transistor and a second cascode transistor coupled between the second output node and the first signal node of the second input transistor, each of the first and second cascode transistors including a control node configured to receive a second biasing voltage.

17. An analog-to-digital converter, comprising:
a successive approximation register configured to output a digital code;
a digital-to-analog converter coupled to the successive approximation register to receive the digital code, the digital-to-analog converter configured to generate an analog output signal based on the digital code; and
a voltage comparator including a first input node coupled to the digital-to-analog converter to receive the analog output signal and a second input node configured to receive an input voltage signal, the voltage comparator including a latch circuit coupled to the successive approximation register and including a pre-amplification circuit including an operational amplifier including:

an input stage circuit including first and second input transistors, each of the first and second input transistors having first and second signal nodes and a control node, the first signal node of the first input transistor coupled to an output node that is coupled to the latch circuit and the control node being coupled to the first input node, the first signal node of the second input transistor coupled to a second output node that is coupled to the latch circuit and the control node being coupled to the second input node, and each of the second signal nodes configured to receive a biasing current;

an output stage circuit including first and second output transistors, each of the first and second output transistors having first and second signal nodes and a control node, the first signal nodes of the first and second output transistors coupled to a reference node, the control node of the first output transistor coupled to the first output node and the control node of the second output transistor coupled to the second output node and the second signal node of the first output transistor being coupled to the second signal node of the second output transistor; and a coupling stage circuit including first and second coupling transistors, each of the first and second coupling transistors having first and second signal nodes and a control node, the first signal node of the first coupling transistor coupled to the second signal node of the first output transistor and the second signal node of the first coupling transistor coupled to the first output node, the first signal node of the second coupling transistor coupled to the second signal node of the second output transistor and the second signal node of the second coupling transistor coupled to the second output node, and the control nodes of the first and second coupling transistors coupled to receive a first biasing voltage.

18. The analog-to-digital converter of claim 17, wherein each of the transistors comprises one of a bipolar transistor and MOS transistor.

19. The analog-to-digital converter of claim 17, wherein the pre-amplification circuit further comprises additional amplification stages coupled in cascade with the operational amplifier.

20. The analog-to-digital converter of claim 17, wherein each of the transistors comprises a MOS transistor.

* * * * *